United States Patent

Neumann et al.

[11] Patent Number: 5,576,142
[45] Date of Patent: Nov. 19, 1996

[54] 2-HYDROXYBENZOPHENONE UV DYES FOR LASER RECORDING PROCESS

[75] Inventors: Stephen M. Neumann, Rochester; Richard P. Henzel, Webster, both of N.Y.

[73] Assignee: Eastman Kodak Company, Rochester, N.Y.

[21] Appl. No.: 390,009

[22] Filed: Feb. 17, 1995

[51] Int. Cl.⁶ .................................................. G03C 5/16
[52] U.S. Cl. ........................... 430/269; 430/270.1; 430/5; 430/945; 430/332; 430/944; 430/964
[58] Field of Search .................................. 430/269, 270, 430/945, 5, 964, 944, 201, 332, 334, 338, 339, 270.1; 503/227

[56] References Cited

U.S. PATENT DOCUMENTS

| | | | |
|---|---|---|---|
| 4,515,877 | 5/1985 | Barzynski et al. | 430/5 |
| 4,981,765 | 1/1991 | Mizuguchi et al. | 430/5 |
| 5,256,506 | 10/1993 | Ellis et al. | 430/20 |
| 5,409,797 | 4/1995 | Hosoi et al. | 430/138 |

*Primary Examiner*—John A. McPherson
*Attorney, Agent, or Firm*—Harold E. Cole

[57] ABSTRACT

A laser recording element comprising a support having thereon a dye layer comprising an image dye dispersed in a polymeric binder, said dye layer having an infrared-absorbing material associated therewith, and wherein said dye layer also contains a 2-hydroxybenzophenone UV-absorbing dye.

4 Claims, No Drawings

2-HYDROXYBENZOPHENONE UV DYES FOR LASER RECORDING PROCESS

This invention relates to use of 2-hydroxybenzophenone UV dyes in a single-sheet laser recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated to produce cyan, magenta and yellow electrical signals. These signals are then transmitted to a thermal printer. To obtain the print, a cyan, magenta yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and apparatus for carrying it out are contained Pat. No. 4,621,271, the disclosure of which is hereby incorporated by reference.

Another way to thermally obtain a print using the electronic signals described above is to use a laser instead of a thermal printing head. In such a laser transfer system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to a receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In another mode of imaging using a laser beam, a laser recording element with a dye layer composition comprising an image dye, an infrared-absorbing material, and a binder coated onto a substrate is imaged from the dye side. The energy provided by the laser drives off the image dye and other components of the dye layer at the spot where the laser beam impinges upon the element. In "laser removal" imaging, the laser radiation causes rapid local changes in the imaging layer, thereby causing the material to be removed from the layer. Usefulness of such a laser recording element is largely determined by the efficiency at which the imaging dye can be removed on laser exposure. The transmission Dmin value is a quantitative measure of dye clean-out: the lower its value at the recording spot, the more complete is the attained dye removal.

In U.S. Ser. No. 259,588 of DoMinh et al., filed Jun. 14, 1994, a single-sheet laser recording element is described which employs a certain liquid UV-absorbing dye. However, there is a problem with this UV-absorbing dye in that under accelerated light fade conditions, the loss in UV density is pronounced, as will be shown by comparative tests hereafter.

U.S. Pat. 5,256,506, in column 12, describes various non-black body absorbers such as dicinnamalacetone and benzophenone derivatives which are supposed to be useful in graphic arts masks. However, there is a problem with dicinnamalacetone in that under accelerated light fade conditions, the loss in UV density is pronounced, as will be shown by comparative tests hereafter. There also is a problem with benzophenone in that it has insufficient UV absorption to be an effective graphic arts mask, as will be shown by comparative tests hereafter.

It is an object of this invention to provide a UV-absorbing dye which will have both an acceptable level of UV absorption and improved stability to UV density loss from light exposure. It is another object of this invention to provide a single-sheet process which does not require a separate receiving element.

These and other objects are achieved in accordance with the invention which comprises a laser recording element comprising a support having thereon a dye layer comprising an image dye dispersed in a polymeric binder, the dye layer having an infrared-absorbing material associated therewith, and wherein the image dye is a 2-hydroxybenzophenone UV-absorbing dye.

In a preferred embodiment of the invention, the 2-hydroxybenzophenone UV-absorbing dye has the following structure:

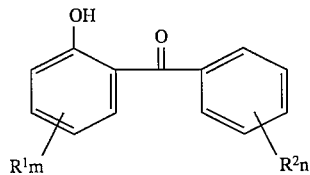

wherein:

$R^1$ and $R^2$ each independently represents hydroxy, alkyl, aryl, fused aryl, fused heteroaryl, carboxy, alkylcarbonyl, arylcarbonyl, hydrogen, alkenyl, cycloalkyl, haloalkyl, cyanoalkyl, hydroxyalkyl, alkoxy, alkoxyalkyl, aryloxyalkyl, alkoxyalkylcarbonyl, aryloxyalkylcarbonyl, alkoxy-alkoxyalkyl, hydroxyalkoxyalkyl, tetrahydrofurfuryl, alkenyloxyalkyl, alkoxycarbonyloxyalkyl, alkenylcarbonyl, aryloxyalkylcarbonyl, aminoalkyl, cyanoalkylcarbonyl, haloalkylcarbonyl, alkylamino, arylamino, amino or halogen;

m is an integer of 1 to 4; and n is an integer of 1 to 5.

The 2-hydroxybenzophenone UV-absorbing dye may be used in an amount of from about 0.05 to about 1.0 g/m² of element.

In a preferred embodiment of the invention, in the above formula, m and n are each 1, $R^1$ is $CH_3$, $OCH_3$ or Cl and $R^2$ is OH or H.

Specific examples of UV dyes according to the above formula include the following:

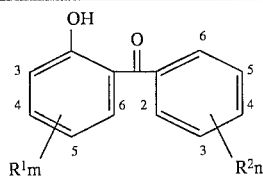

| Compound | R¹ | m | R² | n |
|---|---|---|---|---|
| A | 5-CH₃ | 1 | 2-OH | 1 |
| B | 5-OCH₃ | 1 | H | 1 |
| C | 5-Cl | 1 | H | 1 |
| D | 4-OH | 1 | 3-Cl | 1 |
| E | 5-C₂H₅ | 1 | 3-CH₃ | 1 |
| F | 6-COCH₃ | 1 | 2-Cl, 6-Cl | 2 |
| G | H | 1 | 4-CH₂CH₂OCH₃ | 1 |
| H | 5-C₄H₉-t | 1 | 3-CH₂OC₆H₅ | 1 |
| I | 4-CH₂OCH₂OCH₃ | 1 | 5-N(CH₃)₂ | 1 |
| J | 6-CH₃, 4-CH₃ | 2 | 2-OH, 4-CH₃ | 2 |
| K | 5-CH₂OCH=CHCH₃ | 1 | 4-CH₂CH₂CH₂CN | 1 |
| L | 3-CH₃, 4-COCH=CH₂ | 2 | H | 1 |
| M | 4-CH₃, 5-CH₂CH₃ | 2 | 3-COC₆H₅ | 1 |
| N | 4-CH=CH—CH₃ | 1 | 2-Cl, 4-Cl, 6-Cl | 3 |

A visible image dye can also be used in the laser recording element employed in the invention provided it can be removed by the action of the laser. Especially good results have been obtained with dyes such as anthraquinone dyes, e.g., Sumikaron Violet RS® (product of Sumitomo Chemical Co., Ltd.), Dianix Fast Violet 3R-FS® (product of Mitsubishi Chemical Industries, Ltd.), and Kayalon Polyol Brilliant Blue N-BGM® and KST Black 146® (products of Nippon Kayaku Co., Ltd.); azo dyes such as Kayalon Polyol Brilliant Blue BM®, Kayalon Polyol Dark Blue 2BM®, (products of Nippon Kayaku Co., Ltd.); direct dyes such as Direct Dark Green B® (product of Mitsubishi Chemical Industries, Ltd.) and Direct Brown M® (product of Nippon Kayaku Co. Ltd.); acid dyes such as Kayanol Milling Cyanine 5R® (product of Nippon Kayaku Co. Ltd.); basic dyes such as Sumiacryl Blue 6G® (product of Sumitomo Chemical Co., Ltd.), and Aizen Malachite reen® (product of Hodogaya Chemical Co., Ltd.);

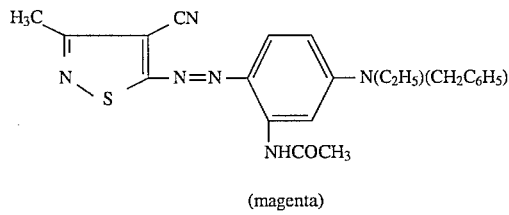

(magenta)

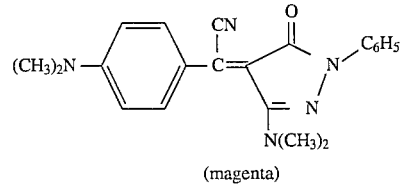

(magenta)

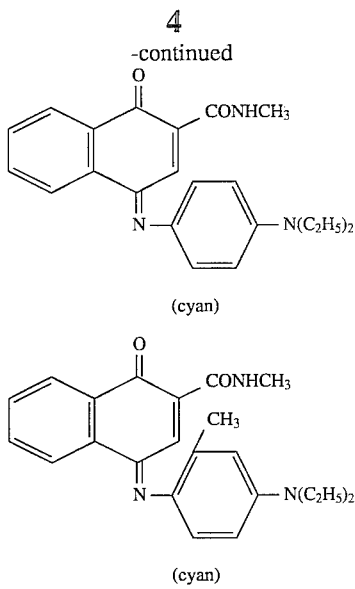

(cyan)

(cyan)

or any of the dyes disclosed in U.S. Patents 4,541,830, 4,698,651, 4,695,287, 4,701,439, 4,757,046, 4,743,582, 4,769,360, and 4,753,922, the disclosures of which are hereby incorporated by reference. The above dyes may be employed singly or in combination. The dyes may be used at a coverage of from about 0.05 to about 1 g/m² and are preferably hydrophobic.

Another embodiment of the invention relates to a process of forming a dye image comprising imagewise-heating, by means of a laser, the recording element described above, the laser exposure taking place through the dye side of the element and causing dye to be removed imagewise to obtain the dye image in the recording element.

The laser recording elements of this invention can be used to obtain medical images, reprographic masks, printing masks, etc. The image obtained can be a positive or a negative image. The dye removal process can generate either continuous (photographic-like) or halftone images.

The invention is especially useful in making reprographic masks which are used in publishing and in the generation of printed circuit boards. The masks are placed over a photosensitive material, such as a printing plate, and exposed to a light source. The photosensitive material usually is activated only by certain wavelengths. For example, the photosensitive material can be a polymer which is crosslinked or hardened upon exposure to ultraviolet or blue light but is not affected by red or green light. For these photosensitive materials, the mask, which is used to block light during exposure, must absorb all wavelengths which activate the photosensitive material in the Dmax regions and absorb little in the Dmin regions. For printing plates, it is therefore important that the mask have high blue and UV Dmax. If it does not do this, the printing plate would not be developable to give regions which take up ink and regions which do not.

By use of this invention, a mask can be obtained which has enhanced light stability for making multiple printing plates or circuit boards without mask degradation.

Any polymeric material may be used as the binder in the recording element employed in the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly(vinyl acetate); polystyrene; poly (styrene-co-acrylonitrile); a polysulfone; a poly (phenylene oxide); a poly (ethylene oxide); a poly(vinyl alcohol-co-acetal) such as poly(vinyl acetal), poly(vinyl alcohol-co-butyral) or poly(vinyl benzal); or mixtures or copolymers thereof. The binder may be used at a coverage of from about 0.1 to about 5 g/m².

In a preferred embodiment, the polymeric binder used in the recording element employed in the process of the invention has a polystyrene equivalent molecular weight of at least 100,000 as measured by size exclusion chromatography, as described in U.S. Pat. No. 5,330,876, the disclosure of which is hereby incorporated by reference.

A barrier layer may be employed in the laser recording element of the invention if desired, as described in copending U.S. Ser. No. 321,282, filed Oct. 11, 1994, and entitled BARRIER LAYER FOR LASER ABLATIVE IMAGING, now U.S. Pat. No. 5,459,017, the disclosure of which is hereby incorporated by reference.

To obtain a laser-induced image according to the invention, an infrared diode laser is preferably employed since it offers substantial advantages in terms of its small size, low cost, stability, reliability, ruggedness, and ease of modulation. In practice, before an infrared laser can be used to heat a recording element, the element must contain an infrared-absorbing material, such as cyanine infrared-absorbing dyes as described in U.S. Ser. No. 099,969, filed Jul. 30, 1993, and entitled, "INFRARED-ABSORBING CYANINE DYES FOR LASER ABLATIVE IMAGING", now abandoned or other materials as described in the following U.S. Pat. Nos.: 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat. The infrared-absorbing dye may be contained in the dye layer itself or in a separate layer associated therewith, i.e., above or below the dye layer. Preferably, the laser exposure in the process of the invention takes place through the dye side of the recording element, which enables this process to be a single-sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

The dye layer of the laser recording element of the invention may be coated on the support or printed thereon by a printing technique such as a gravure process.

Any material can be used as the support for the recording element of the invention provided it is dimensionally stable and can withstand the heat of the laser. Such materials include polyesters such as poly(ethylene naphthalate); polysulfones; poly(ethylene terephthalate); polyamides; polycarbonates; cellulose esters such as cellulose acetate; fluorine polymers such as poly(vinylidene fluoride) or poly-(tetrafluoroethylene-co-hexa-fluoro propylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following example is provided to illustrate the invention.

EXAMPLE

The following materials were employed in this example:

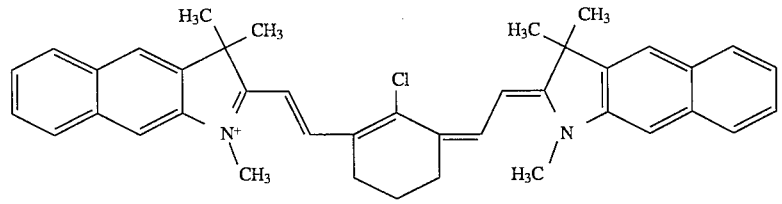

IR-1

Control-1

(U.S. Ser. No. 259,588 of DoMinh et al., filed June 14, 1994

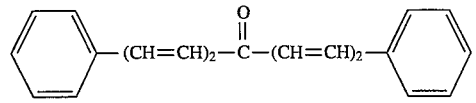

-continued

Control-2

Dicinnamalacetone
(U.S. Pat. No. 5,256,506, col. 12, lines 57–58)

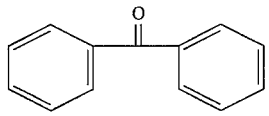

Control-3

Benzophenone
(U.S. Pat. No. 5,256,506, col. 12, line 58)

A 100 μm thick poly(ethylene terephthalate) support was coated with a dye layer consisting of 0.22 g/m² infrared dye IR-1, 0.60 g/m² nitrocellulose, and either 0.27 g/m² of Control-1 or 0.86 mmol/m² of Control-2, Control-3, Compound A, Compound B or Compound C coated from tetrahydrofuran.

The stability of the resulting dye layers was measured using an X-Rite Densitometer (Model 361T, X-Rite Corp.) by the percent change in UV density between a covered and uncovered sample after exposure to four hours of 50 kLux sunshine. The following results were obtained:

| Dye | Target Laydown (g/m²) | UV Density COVERED | UV Density UNCOVERED | Percent UV Change |
| --- | --- | --- | --- | --- |
| A | 0.21 | 1.24 | 1.09 | −12 |
| B | 0.20 | 0.71 | 0.63 | −11 |
| C | 0.20 | 0.86 | 0.81 | −6 |
| Control-1 | 0.27 | 2.98 | 2.13 | −29 |
| Control-2 | 0.25 | 2.16 | 0.18 | −92 |
| Control-3 | 0.16 | 0.20 | 0.23 | +11 |

The above results show that the dyes of the invention have a substantial improvement in UV density loss, and thus are more resistant to fading in the UV than Control dyes 1 and 2. Control dye 3 has insufficient UV density to be an effective graphic arts mask material.

Printing

Samples of the above example were laser written on a drum printer using a laser diode print head, where each laser beam has a wavelength range of 830–840 nm and a nominal power output of 550 mW at the film plane.

The drum, 53 cm in circumference, was rotated at varying speeds and the imaging electronics were activated to provide adequate exposure. The translation stage was incrementally advanced across the recording element by means of a lead screw turned by a microstepping motor, to give a center-to-center line distance of 10.58 μm (945 lines per centimeter or 2400 lines per inch). The laser energy impinges on the recording element in accordance with the electronic information of the image. The energy provided by the laser drives off the image dye and other components of the dye layer at the spot where the laser beam impinges upon the element. The removed dye and other effluents are collected by suction. The measured total power at the focal plane was 550 mW per channel maximum. A useful image was obtained.

The invention has been described in detail with particular reference to preferred embodiments thereof, but it will be understood that variations and modifications can be effected within the spirit and scope of the invention.

What is claimed is:

1. A single sheet process of forming a dye image in the absence of a receiving element comprising imagewise-heating, by means of a laser, a recording element comprising a support having thereon a dye layer comprising an image dye dispersed in a polymeric binder, said dye layer having an infrared-absorbing material associated therewith, said laser exposure taking place through the side of the support having thereon said dye layer, and causing dye to be removed imagewise to obtain said dye image in said recording element, wherein said image dye is a 2-hydroxybenzophenone UV-absorbing dye.

2. The process of claim 1 wherein said UV-absorbing dye has the following structure:

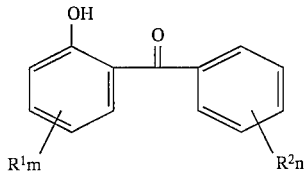

wherein:

$R^1$ and $R^2$ each independently represents hydroxy, alkyl, aryl, fused aryl, fused heteroaryl, carboxy, alkylcarbonyl, arylcarbonyl, hydrogen, alkenyl, cycloalkyl, haloalkyl, cyanoalkyl, hydroxyalkyl, alkoxy, alkoxyalkyl, aryloxyalkyl, alkoxyalkylcarbonyl, aryloxyalkylcarbonyl, alkoxyalkoxyalkyl, hydroxyalkoxyalkyl, tetrahydrofurfuryl, alkenyloxyalkyl, alkoxycarbonyloxyalkyl, alkenylcarbonyl, aryloxyalkylcarbonyl, aminoalkyl, cyanoalkylcarbonyl, haloalkylcarbonyl, alkylamino, arylamino, amino or halogen;

m is an integer of 1 to 4; and n is an integer of 1 to 5.

3. The process of claim 2 wherein m and n are each 1, $R^1$ is $CH_3$, $OCH_3$ or Cl and $R^2$ is OH or H.

4. The process of claim 1 wherein said infrared-absorbing material is a dye which is contained in said dye layer.

* * * * *